United States Patent [19]

Lill

[11] 4,042,917
[45] Aug. 16, 1977

[54] MAGNETO-RESISTIVE DOMAIN DETECTOR FOR CYLINDER-DOMAIN-TRANSPORT MEMORY

[75] Inventor: Arnulf Lill, Munich, Germany

[73] Assignee: Siemens Aktiengesellschaft, Berlin & Munich, Germany

[21] Appl. No.: 606,477

[22] Filed: Aug. 21, 1975

[30] Foreign Application Priority Data

Aug. 27, 1974 Germany .............................. 2440997

[51] Int. Cl.² ............................................ G11C 11/02
[52] U.S. Cl. ........................ 340/174 TF; 340/174 SR
[58] Field of Search ................... 340/174 TF, 174 SR

[56] References Cited

U.S. PATENT DOCUMENTS 3,828,330   8/1974   Parzefall ........................ 340/174 TF
3,895,363   7/1975   Braginski et al. ............. 340/174 TF

OTHER PUBLICATIONS

Evolution of Bubble Circuits Processed by a Single Mask Level Bobeck et al.; IEEE Trans. on Magnetics; vol. 9, No. 3; 9/73; pp. 474–480.

Primary Examiner—Marshall M. Curtis
Attorney, Agent, or Firm—Hill, Gross, Simpson, Van Santen, Steadman, Chiara & Simpson

[57] ABSTRACT

A magneto-resistive domain detector for reading the stored information of a cylinder-domain transport memory having a layer-shaped detector strip made of magneto-resistive material which extends perpendicular to the cylinder-domain path, and including a domain stretcher which is adjacent to and galvanically decoupled from the detector strip.

6 Claims, 4 Drawing Figures

4,042,917

MAGNETO-RESISTIVE DOMAIN DETECTOR FOR CYLINDER-DOMAIN-TRANSPORT MEMORY

BACKGROUND OF THE INVENTION

Field of the Invention

The field of art to which this invention pertains is magneto-resistive domain detectors for cylinder-domain transport memories and in particular to domain detectors having a detector strip with a domain stretcher adjacent thereto and galvancially decoupled therefrom.

SUMMARY OF THE INVENTION

It is an important feature of the present invention to provide an improved magneto-resistive domain detector for a cylinder-domain transport memory.

It is another feature of the present invention to provide a domain detector as described above which includes a detector strip and a domain stretcher which is galvanically decoupled from the strip.

It is a principal object of the present invention to provide a domain detector as described above wherein the domain stretcher has the ends thereof which are adjacent to the detector strip physically spaced from the strip to provide said galvancially decoupling.

It is another feature of the present invention to provide a domain detector as described above wherein the ends of the domain stretcher which overlap with the detector strip are insulated therefrom to provide galvanic decoupling.

These and other objects, features and advantages of the present invention will be understood in greater detail from the following description wherein reference numerals are utilized to designate a preferred embodiment.

DESCRIPTION OF THE PREFERRED EMBODIMENT

Figure 1:
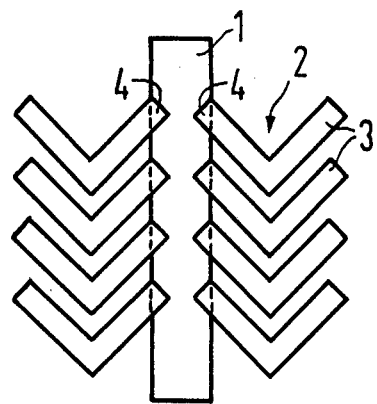
FIG. 1 shows a detector strip for a domain detector using a domain stretcher according to prior art techniques.

Circular-cylindrical magnetic domains, so-called cylinder domains, having a magnetizing direction opposite to the direction of the surrounding and magnetic holding field exist in ferro-magnetic single-crystal layers with a uni-axial anisotropy perpendicular to the layer plane when an outer magnetic support or holding field of a suitable direction and magnitude is applied. The cylinder domains may be moved at high speed by way of a magnetic field rotating in the layer plane in conjunction with a manipulation pattern applied onto the memory layer. The individual elements of the manipulation pattern are made of magnetizable material such as Ni—Fe alloy and are layer-shaped and rectangularly applied onto the layer plane, and they are thus suited for the construction of shift registers which can be coupled together to produce serial memories.

To indicate the presence or absence of a cylinder domain at a certain place within memory, a detector is required to convert the magnetic field produced by a cylinder domain into an electrical signal. Detectors are known in the art which utilize varied physical effects, for instance, the Faraday effect in the case of magneto-optical reading and the Hall effect or the change of resistance of ferro-magnetic materials in the magnetic field. Due to technologically simple construction, the magneto-resistive domain detector (magneto-resistance change) has generally dominated the art. A layer-shaped detector strip, preferably made of a magneto-striction-free NiFe alloy, is used as a detector element. The strip extends perpendicularly to the cylinder-domain path and is applied, for instance, by way of evaporation onto the memory plane.

When the detector strip is not exposed to any magnetic stray field of a cylinder domain, the magnetization $M_D$ of the detector strip is parallel to the direction of a current $i_D$ flowing through the detector in a memory operation. If a cylinder domain passes by the detector strip, its stray field will rotate the magnetization about an angle from the current direction. The resistance $R_O$ of the detector element thus changes by the amount $\Delta R$. This resistance change produces a voltage drop $\Delta U = i_D \cdot \Delta R\ (\sigma)$, which can be further processed as read signals.

In the case of a given detector current $i_D$, the read signal is thus higher when the resistance change $\Delta R$ of the detector element, caused by the cylinder domain becomes higher. $\Delta R$, on one hand, is a function of the specific magneto-resistance change of the detector material. It first increases linearly with the magnetic field and then moves toward saturation value. In order to entirely saturate the detector strip by means of the stray field $H_D$ of the cylinder domain, the latter must be larger than the sum of the anisotropic field strength $H_K$ of the detector material which is usually constituted by a ferro-magnetic Ni—Fe alloy plus the demagnetized field $H_{ent}$ of the detector strip.

However, an increase in the change in resistance can also be obtained by making the detector strip as long as possible. However, this is only useful when the detector strip has its entire length included in the stray field of the cylinder domain, and due to this the cylinder domain is step-by-step stretched to the given length of the detector strip with the help of a so-called domain stretcher, generally a suitable layer-shaped pattern made of a magneto-striction-free ferro-magnetic nickel-iron alloy, i.e., it is stretched to obtain a long strip domain which will widen the stray field of the cylinder domain, which is to be detected. Usually the chevron domain stretcher shown in FIG. 1 is used for stretching the domain. The detector strip 1 is placed between chevron arrangements 2 arranged symmetrically to the detector strip, whereby these arrangements are formed from the same number of 90° chevron segments 3 which respectively overlap and have a metal contact with the detector strip in the areas 4. It should be mentioned that further chevron arrangements parallel to the described arrangements exist in the direction of the cylinder domain path which is not shown in FIG. 1, and that the number of chevron segments decreases in that direction.

In the case of this prior art magneto-resistive domain detector, the saturation value of the relative magneto-resistance change of the detector element is below the value of the detector material, so that the magneto-resistive properties of the detector material are only partially utilized for the signal detection and thus only read signals of a relatively minor size are obtained.

The present invention provides a magneto-resistive domain detector having an acceptable read signal, as compared with prior art magneto-resistive domain detectors, by increasing the resistance change of the detector strip due to the stray field of the cylinder domains.

The invention results from the recognition that the above-described disadvantage is due to the overlapping of the magnetic segments of the domain stretcher with the detector strip. Proceeding from this recognition, the invention suggests for a magneto-resistive domain detector with a layer-shaped detector strip extending perpendicularly to the cylinder-domain path and made of magneto-resistive material and with a domain stretcher, that the detector strip and domain stretcher be galvancially decoupled.

This may, for instance, be effected in such a way that the end of the domain stretcher which is adjacent to the detector strip i.e. the boundary line of each segment adjacent to the detector strip is spaced from the strip. It is also possible that the part of the domain stretcher adjacent to the detector strip and the detector strip are overlapping and may be galvancially decoupled by way of an intermediate insulating layer, such as an $SiO_2$ layer.

In a domain detector of this kind, the magneto-resistance change of the detector material can be used optimally by the signal. detection. It must be determined for instance, that an increase of the distance of the arrangements at both sides of the detector strip, belonging to the domain stretcher does not interfere with the cylinder-domain movement. This problem can be solved in such a way that without changing the mutal distances of the arrangements adjacent to the detector strip particular the chevron arrangements, the ends of the segments overlapping the detector strips in FIG. 1 are omitted and, the width of the detector strip is somewhat decreased.

Figure 2:
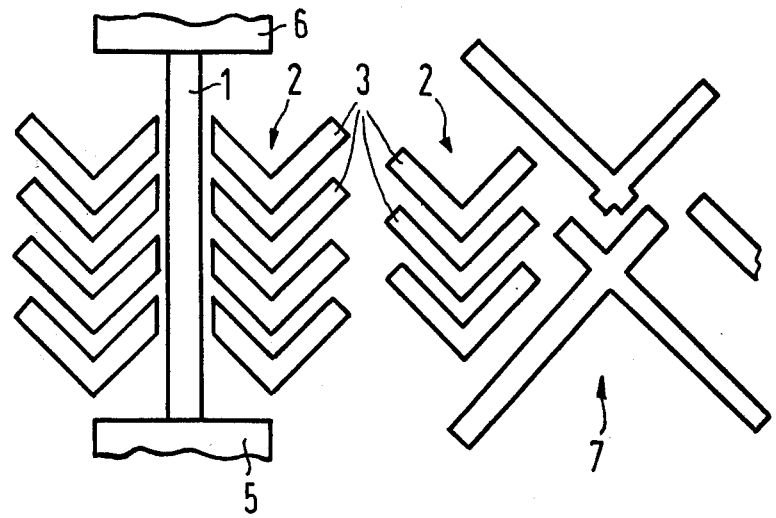
FIG. 2 shows a detector according to the present invention utilizing domain stretchers which are decoupled from the detector strip.

A domain detector in accordance with the invention changed in the above sense has been shown in FIG. 2 whereby equal parts have been denoted by equal reference numbers, and the elements 5 and 6 represent the inputs toward detector strips 1 and 7 of one of the indicated cylinder-domain paths. As previously mentioned, the arrangement shown on the right of the detector strip 1 in FIG. 2 is also present on the left, but has not been shown. In a sample embodiment of a domain detector in accordance with this invention, which has been tested and whose values have been shown in FIGS. 3 and 4, the width of the detector strip is 7.5/um and its length is 208/um.

Figure 3:
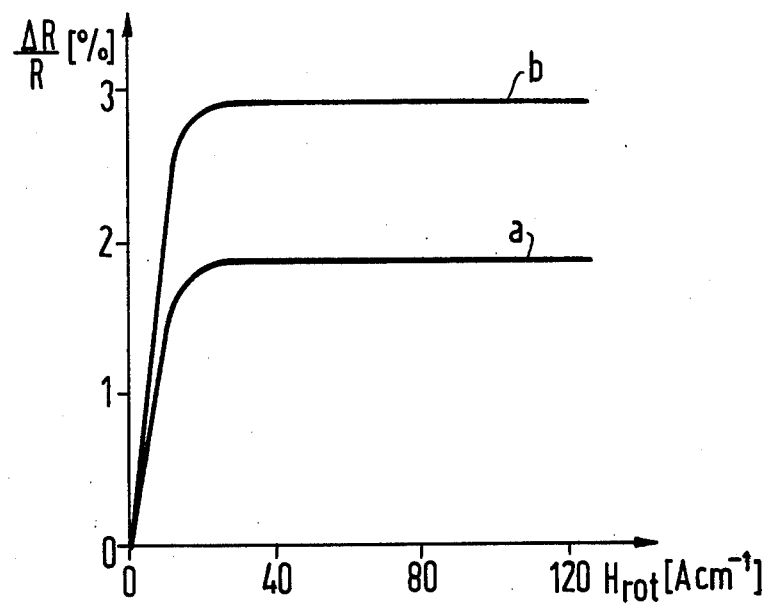
FIG. 3 is a graph showing the relative magneto-resistance change with respect to the rotary magnetic field for the conditions of the arrangements shown in FIGS. 1 and 2 respectively.

In FIG. 3, the relative magneto-resistance change $\Delta R/R$ depending on the rotary magnetic field $H_{rot}$ has been shown for the domain detectors represented in FIGS. 1 and 2, whereby the curve $a$ is associated with the prior art domain detector in accordance with FIG. 1 and the curve $b$ with the domain detector in accordance with FIG. 2. Thus, the saturation value of the magneto-resistance change is approximately 50% higher for the domain detector in accordance with FIG. 2. It can furthermore be seen, that despite the decreased width of the detector strip in the case of the domain detector in accordance with FIG. 2 and the increase of the demagnetized field of the detector strip, which is connected therewith, the magnetic field required for the saturation of the domain detector has not increased. Corresponding to the higher magneto-resistance change, the signal produced by a cylinder domain at the domain detector must be larger for the arrangement in accordance with FIG. 2.

Figure 4:
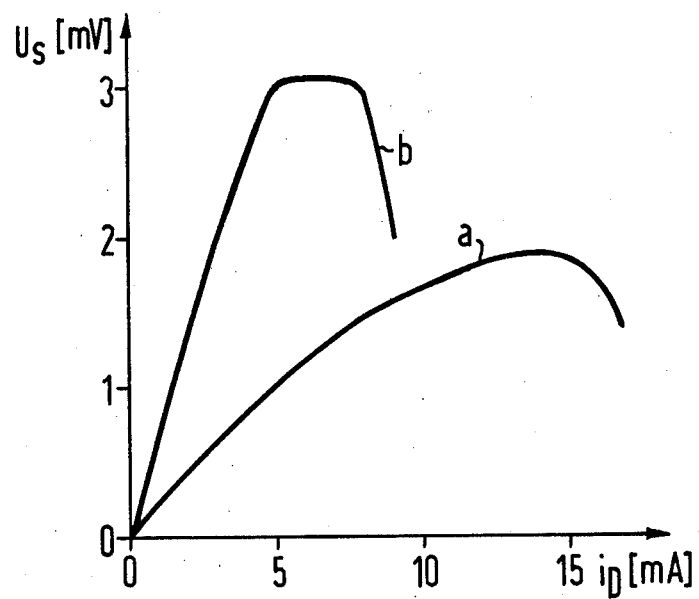
FIG. 4 is a graph showing the cylinder-domain signal with respect to the detector current for the detector arrangements of FIGS. 1 and 2 respectively.

This is shown in FIG. 4 where the cylinder-domain signal $U_S$ (cylinder domain diameter approximately 9/um), which has been measured in the 50-Hertz field of rotation has been shown as a function of the detector current $i_D$, as it has been measured in the compared detectors in accordance with FIGS. 1 and 2. It shows that the sensitivity of the domain detector in accordance with FIG. 2 is, at 0.6 mV/mA approximately a factor of 3 larger than for the arrangement of FIG. 1. The domain detector in accordance with FIG. 2 had also been tested in a magnetic field of rotation at 100kHz, and it supplied the expected high signal even under these operational conditions.

I claim as my invention:

1. A magneto-resistive domain detector for reading the stored information of a cylinder-domain transport memory comprising:
   a layer-shaped detector strip disposed on the memory perpendicularly to the cylinder domain path and being formed of a magneto-resistive material and having a domain stretcher adjacent to but galvancially decoupled from the detector strip.

2. A magneto-resistive domain detector in accordance with claim 1 wherein the ends of the domain stretcher adjacent to the detector strip are spaced therefrom to provide said galvanic decoupling.

3. A magneto-resistive domain detector in accordance with claim 1 wherein the ends of the domain stretcher adjacent to the detector strip overlap with the detector strip and insulating intermediate layer is disposed therebetween to provide said galvanic decoupling.

4. a magneto-resistive domain detector in accordance with calim 1 wherein the domain stretcher comprises at least one chevron arrangement placed on both sides of the detector strip.

5. A magneto-resistive domain detector in accordance with claim 1 wherein the domain stretcher comprises a plurality of chevrons arranged parallel to each to form a set and wherein at least one set is disposed on both sides of the detector strip.

6. A magneto-resistive domain detector in accordance with claim 1 wherein the edges of each of said chevrons facing said detector strip are spaced therefrom to provide said galvanic decoupling.

* * * * *